(12) United States Patent
Sinha

(10) Patent No.: US 11,904,533 B2
(45) Date of Patent: Feb. 20, 2024

(54) COATED POWDER FOR IMPROVED ADDITIVE MANUFACTURING PARTS

(71) Applicant: The Boeing Company, Chicago, IL (US)

(72) Inventor: Nishant Sinha, Bangalore (IN)

(73) Assignee: The Boeing Company, Chicago, IL (US)

( * ) Notice: Subject to any disclaimer, the term of this patent is extended or adjusted under 35 U.S.C. 154(b) by 627 days.

(21) Appl. No.: 16/737,626

(22) Filed: Jan. 8, 2020

(65) Prior Publication Data

US 2021/0206053 A1 Jul. 8, 2021

(51) Int. Cl.
*B29C 64/00* (2017.01)
*B29C 64/153* (2017.01)
(Continued)

(52) U.S. Cl.
CPC ...... *B29C 64/153* (2017.08); *B01D 67/00045* (2022.08); *B01D 67/00415* (2022.08); *B05D 5/083* (2013.01); *B22F 10/00* (2021.01); *B22F 10/85* (2021.01); *B22F 12/00* (2021.01); *B22F 12/82* (2021.01); *B29C 64/00* (2017.08); *B29C 64/10* (2017.08); *B29C 64/176* (2017.08); *B29C 64/182* (2017.08); *B29C 64/20* (2017.08); *B29C 64/205* (2017.08); *B29C 64/227* (2017.08);
(Continued)

(58) Field of Classification Search
CPC .............................. B29C 64/153; C08G 73/10
See application file for complete search history.

(56) References Cited

U.S. PATENT DOCUMENTS 3,880,116 A * 4/1975 Prillig ...................... B01J 2/003
 118/62
4,784,878 A * 11/1988 Haak ........................ B01J 2/003
 118/313
(Continued)

FOREIGN PATENT DOCUMENTS

CN 101304816 A 11/2008
CN 107073825 A 8/2017
(Continued)

OTHER PUBLICATIONS https://www.youtube.com/watch?v=snLEMu1NAdM (Year: 2013).*
(Continued)

*Primary Examiner* — Nicholas R Krasnow
(74) *Attorney, Agent, or Firm* — Quinn IP Law

(57) ABSTRACT

A coated powder for use in additive manufacturing includes a base polymer layer formed of a base polymer material and a coating polymer layer formed of a coating polymer material. At least the coating polymer material is susceptible to dielectric heating in response to electromagnetic radiation, thereby promoting fusion between adjacent particles of coated powder that are deposited during the additive manufacturing process. Specifically, when electromagnetic radiation is applied to at least an interface area between adjacent particles of coated powder, the polymer coating layer melts to diffuse across the interface area, thereby preventing formation of voids. The base polymer material and the coating polymer material also may have similar melting points and compatible solubility parameters to further promote fusion between particles.

18 Claims, 2 Drawing Sheets

(51) Int. Cl.

| | | |
|---|---|---|
| *C08G 73/10* | (2006.01) | |
| *C08J 7/04* | (2020.01) | |
| *B29C 64/30* | (2017.01) | |
| *B29C 64/205* | (2017.01) | |
| *B22F 12/00* | (2021.01) | |
| *B33Y 50/00* | (2015.01) | |
| *B29C 64/393* | (2017.01) | |
| *B29C 64/10* | (2017.01) | |
| *B33Y 80/00* | (2015.01) | |
| *B33Y 40/10* | (2020.01) | |
| *B29C 64/176* | (2017.01) | |
| *B33Y 40/20* | (2020.01) | |
| *B33Y 50/02* | (2015.01) | |
| *B29C 64/307* | (2017.01) | |
| *B05D 5/08* | (2006.01) | |
| *B22F 10/85* | (2021.01) | |
| *B29C 64/227* | (2017.01) | |
| *B33Y 30/00* | (2015.01) | |
| *B01D 67/00* | (2006.01) | |
| *B29C 64/245* | (2017.01) | |
| *B33Y 99/00* | (2015.01) | |
| *B29C 64/25* | (2017.01) | |
| *B29C 64/255* | (2017.01) | |
| *B22F 10/00* | (2021.01) | |
| *B29C 64/182* | (2017.01) | |
| *B33Y 40/00* | (2020.01) | |
| *B29C 64/40* | (2017.01) | |
| *B29C 64/386* | (2017.01) | |
| *B29C 64/20* | (2017.01) | |
| *B22F 12/82* | (2021.01) | |
| *B33Y 10/00* | (2015.01) | |
| *B33Y 70/00* | (2020.01) | |
| *B29K 29/00* | (2006.01) | |
| *B29K 279/00* | (2006.01) | |
| *G03F 7/00* | (2006.01) | |

(52) U.S. Cl.
CPC ........... *B29C 64/245* (2017.08); *B29C 64/25* (2017.08); *B29C 64/255* (2017.08); *B29C 64/30* (2017.08); *B29C 64/307* (2017.08); *B29C 64/386* (2017.08); *B29C 64/393* (2017.08); *B29C 64/40* (2017.08); *B33Y 30/00* (2014.12); *B33Y 40/00* (2014.12); *B33Y 40/10* (2020.01); *B33Y 40/20* (2020.01); *B33Y 50/00* (2014.12); *B33Y 50/02* (2014.12); *B33Y 80/00* (2014.12); *B33Y 99/00* (2014.12); *C08G 73/10* (2013.01); *C08J 7/04* (2013.01); *B29K 2029/04* (2013.01); *B29K 2279/08* (2013.01); *B33Y 10/00* (2014.12); *B33Y 70/00* (2014.12); *C08J 2329/04* (2013.01); *C08J 2379/08* (2013.01); *G03F 7/70416* (2013.01); *G03G 2215/2054* (2013.01); *G05B 2219/49023* (2013.01); *G05B 2219/49246* (2013.01); *H05K 2201/015* (2013.01); *Y10T 156/1722* (2015.01); *Y10T 156/1798* (2015.01)

(56) References Cited

U.S. PATENT DOCUMENTS

| | | | |
|---|---|---|---|
| 5,248,550 A * | 9/1993 | Turpin | ............... C08J 5/249 |
| | | | 528/480 |
| 10,414,147 B2 | 9/2019 | Sweeney et al. | |
| 2003/0054096 A1* | 3/2003 | Tschudin | ............... B01J 2/16 |
| | | | 427/427.7 |
| 2004/0038611 A1 | 2/2004 | Amou et al. | |
| 2006/0251826 A1 | 11/2006 | Pfeifer et al. | |
| 2014/0272430 A1* | 9/2014 | Kalayaraman | ........... C09D 7/69 |
| | | | 428/458 |
| 2015/0148467 A1 | 5/2015 | Greger et al. | |
| 2016/0200011 A1 | 7/2016 | Rothfuss et al. | |
| 2016/0297104 A1 | 10/2016 | Guillemette et al. | |
| 2017/0072633 A1 | 3/2017 | Hsu | |
| 2017/0173923 A1 | 6/2017 | Davis et al. | |
| 2018/0074231 A1 | 3/2018 | Koenig, II | |
| 2018/0141274 A1 | 5/2018 | Fink et al. | |
| 2019/0366626 A1 | 12/2019 | Swartz et al. | |
| 2021/0002193 A1* | 1/2021 | Lee | ............... B01J 23/462 |
| 2021/0002468 A1* | 1/2021 | Sugihara | ............... C08L 29/10 |

FOREIGN PATENT DOCUMENTS

| | | |
|---|---|---|
| CN | 108495740 A | 9/2018 |
| GB | 1167436 A | 10/1969 |
| GB | 1200890 A | 8/1970 |
| WO | 2011160181 A1 | 12/2011 |
| WO | 2018148359 A1 | 8/2019 |

OTHER PUBLICATIONS

Search Report for related European Application No. 20217755.6; dated May 31, 2021.
Search Report for related European Application No. 202117760.6; dated Jun. 15, 2021.
Search Report for related European Application No. 21150187.9; dated Jun. 15, 2021.
Anonymous: "Electrical Properties of Plastics", Jul. 17, 2019 (Jul. 17, 2019), XP055808215 Retrieved from the Internet: URL:https://web.archive.org/web/2019071723 2331/https://members.tm.net/lapointe/plast ics.htm [retrieved on May 27, 2021] *the whole document *.
Polymerdatabase: "Prediction of Solubility Parameters A Comparison of four Group Contribution Methods", Jun. 1, 2015 (Jun. 1, 2015), XP055687364, Retrieved from the Internet: URL:http://polymerdatabase.com/pdf/crow_solparJune2015.pdf [retrieved on Apr. 20, 2020].
Bur et al: "Dielectric properties of polymers at microwave frequencies: a review", Polymer, Elsevier Science Publishers B.V, GB, vol. 26, No. 7, Jul. 1, 1985 (Jul. 1, 1985), pp. 963-977, XP024117585, ISSN: 0032-3861, DOI: 10.1016/0032-3861(85)90216-2 [retrieved on Julo. 1, 1985] * figure 20 *.

* cited by examiner

COATED POWDER FOR IMPROVED ADDITIVE MANUFACTURING PARTS

FIELD

The present disclosure relates to additive manufacturing apparatus and methods, and particularly to powder-based additive manufacturing. The additive manufacturing process disclosed herein can be useful in producing parts including environmental control ducts, door panels, tools, jigs, fixtures, and the like. Examples of the disclosure may find use in a variety of potential applications, particularly in the transportation industry, including for example, aerospace, marine, automotive, and for example a casing used for auxiliary power units (APUs).

BACKGROUND

Parts and other components may be manufactured using various manufacturing techniques depending on the performance requirements of the parts and the availability of manufacturing equipment. Selective laser sintering (SLS) and selective laser melting (SLM) are powder-based additive manufacturing techniques that may be used to build components, in which a layer of powder is maintained at an elevated temperature and is selectively sintered or melted using a laser. Once a first build layer has been formed, successive build layers are formed on top of the first build layer using a similar process until the desired three-dimensional object is complete. Powders used in these processes are typically formed of thermoplastic, polycarbonate, or other similarly configured material. Powder-based additive manufacturing, such as SLS and SLM, may introduce voids between powder particles within a build layer and between adjacent build layers formed during the process, thereby resulting in an object with reduced structural integrity.

SUMMARY

According to one aspect of the present disclosure, a coated powder is provided for use in an additive manufacturing process. The coated powder includes a base polymer layer formed of a base polymer material having a first dielectric loss factor, and a coating polymer layer surrounding the base polymer layer and formed of a coating polymer material having a second dielectric loss factor, wherein the second dielectric loss factor of the coating polymer material is greater than the first dielectric loss factor of the base polymer material.

According to another aspect of the present disclosure, a method of fabricating a coated powder for use in an additive manufacturing process includes advancing a plurality of powder particles through a chamber, each of the plurality of powder particles being formed of a base polymer material, applying a liquid coating to an exterior of each of the plurality of powder particles, the liquid coating being formed of a coating polymer material, and drying the liquid coating on the plurality of powder particles to form a plurality of coated powder particles. Each of the plurality of coated powder particles comprises a base polymer layer formed by the powder particle and a coating polymer layer formed by the liquid coating after drying.

According to a further aspect of the present disclosure, a method of fabricating an object by fused powder fabrication includes forming a coated powder by advancing a plurality of powder particles through a chamber, each of the plurality of powder particles being formed of a base polymer material, applying a liquid coating to an exterior of each of the plurality of powder particles, the liquid coating being formed of a coating polymer material, and drying the liquid coating on the plurality of powder particles to form a plurality of coated powder particles, so that each of the plurality of coated powder particles comprises a base polymer layer formed by the powder particle and a coating polymer layer formed by the liquid coating after drying. The method further includes depositing the coated powder in a first build layer on a substrate, heating selected portions of the first build layer, depositing the coated powder in a second build layer on the substrate and over the first build layer, heating selected portions of the second build layer, and dielectrically heating at least the coating polymer layer of the coated powder in the selected portions of the first and second build layers using electromagnetic radiation, thereby to fuse adjacent particles of the coated powder across an interface area.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and advantages thereof, will best be understood by reference to the following detailed description of illustrative examples of the present disclosure when read in conjunction with the accompanying drawings, wherein:

DETAILED DESCRIPTION

The following detailed description is directed to powder-based additive manufacturing technologies, such as selective laser sintering (SLS) or selective laser melting (SLM). The examples disclosed herein include a coated powder for use in such processes, methods for forming the coated powder, and methods for building an object using the coated powder in an additive manufacturing process. The coated powder includes particles having a base polymer layer formed of a base polymer material surrounded by a coating polymer layer formed of a coating polymer material. The coated powder is susceptible to selective heating, such as dielectric heating through the use of electromagnetic radiation, to improve the strength of the object built.

Definitions

"Fused Filament Fabrication (FFF) is an additive manufacturing technology used for building up of layers to form products and for example, three-dimensional products, prototypes or models. The process can be rapid for quick prototyping and manufacturing to build layer after layer of molten material to create a model, product or like object.

As used herein, the term "filament" refers to feedstock used in an additive manufacturing process that has a slender, threadlike shape.

The term "powder coating" or "powder coated" or the like terms refer to herein as is a type of coating that is applied, for example, as dry powder and usually applied electrostatically and then cured via heat, electromagnetic radiation such as microwave, or other curing source. The powder may be a thermoplastic, a thermoset polymer, or other like polymer or material.

The phrase "Selective Laser Sintering" or "Selective Laser Melting" and like terms, as used herein refers to an additive manufacturing process using a laser to sinter powdered material, pointing the laser into space, and using a 3D model as the pattern, binding the material together to create a solid structure. Usually, the powdered material is nylon, polyamide or like materials References are made to the accompanying drawings that form a part hereof, and which are shown by way of illustration, specific embodiments, or examples. Like numerals represent like elements through the several figures.

Figure 1:
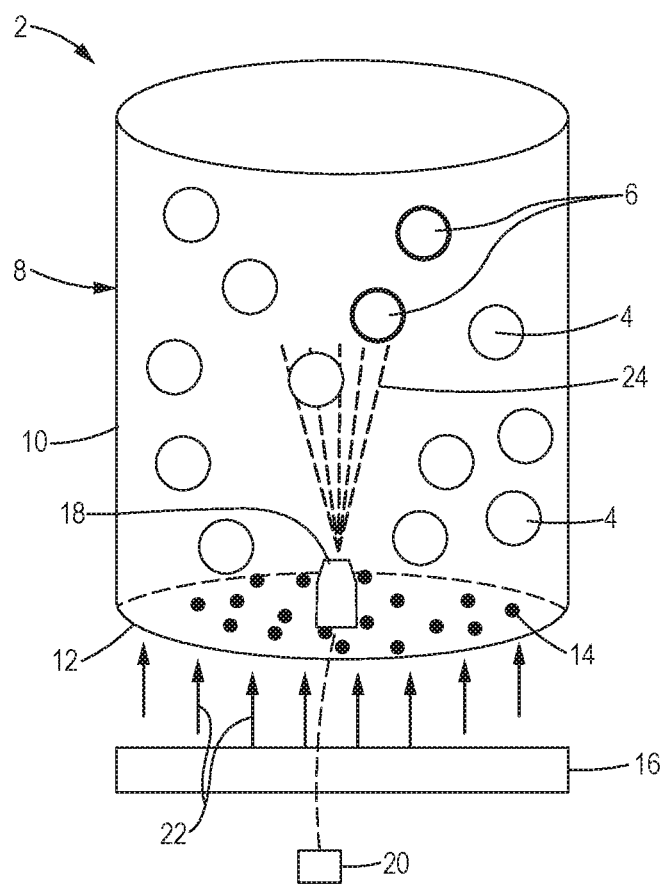
FIG. 1 is a diagrammatic illustration of apparatus for converting powder particles into coated powder particles.

Turning now to the figures, FIG. 1 illustrates an apparatus 2 for converting a powder 4 into a coated powder 6 that can be used in an additive manufacturing process to build an object having improved structural integrity. Specifically, the apparatus 2 includes a coating chamber 8 having a side wall 10 and a base 12. Perforations 14 are formed in the base 12 to permit air from a pressurized air source 16 to pass into the coating chamber 8. A nozzle 18 is disposed inside the coating chamber 8 and is fluidly coupled to a coating supply 20.

Figure 2:
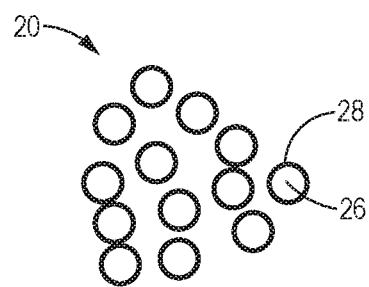
FIG. 2 is an illustration of exemplary coated powder particles formed according to a method of fabricating a coated powder.

In operation, particles of powder 4 are placed at the bottom of the coating chamber 8. The pressurized air source 16 is operated to generate air streams 22 that blow the particles of powder 4 through the coating chamber 8. Simultaneously, the coating supply 20 is operated to spray a coating 24 from the nozzle 18 and throughout the coating chamber 8, thereby to coat the particles of powder 4 with the coating 24. In some examples, positively or negatively charged ions may also be dispersed from the nozzle 18 to facilitate coating of the particles of powder 4 with the coating 24. The coating 24 may be supplied in a liquid phase that subsequently dries and hardens over the powder 4. Ultimately, the apparatus 2 produces the coated powder 6 having a base polymer layer 26 and a coating polymer layer 28, as best shown in FIG. 2.

The materials used to form the base polymer layer 26 and the coating polymer layer 28 of the coated powder 6 permit selective heating during a powder-based additive manufacturing process, thereby promoting inter-layer chain diffusion and bonding so that the resulting build object has improved structural integrity. As discussed in greater detail below, the materials used for the base polymer layer 26 and the coating polymer layer 28 may be selected based on relative responsiveness to dielectric heating, as well as proximity of melting points and solubility parameters.

Regarding responsiveness to dielectric heating, materials used in the coated powder 6 may be selected so that the coating polymer layer 28 is more susceptible to heating in response to electromagnetic radiation than the base polymer layer 26. A property known as dielectric loss factor (which is also known as the dissipation factor and is represented by the symbol tan $\delta$) quantifies a material's ability to dissipate applied electromagnetic energy in the form of heat. A material with a higher dielectric loss factor will heat up more in response to an applied electromagnetic field than a material with a lower dielectric loss factor. To focus heating at the external surface of the coated powder 6, the coating polymer layer 28 is formed of a coating polymer material having a higher dielectric loss factor than a base polymer material used for the base polymer layer 26. In some examples, the coating polymer material has a tan $\delta$ value at least about 50 times the tan $\delta$ value of the base polymer material. Additionally or alternatively, the base polymer material has a tan $\delta$ value less than 0.05 and the coating polymer material may have a tan $\delta$ greater than 0.05.

The coated powder 6 further may use materials for the base polymer layer 26 and the coating polymer layer 28 that have similar melting points, which improves strength of the build object formed by build layers of coated powder 6 deposited during the additive manufacturing process. As noted above, the coating polymer material has a higher dielectric loss factor, and therefore generates heat directly in response to the application of electromagnetic energy. The base polymer material may be selected so that it has a melting point that is proximate to that of the coating polymer material, so that heating of the coating polymer layer 28 by the electromagnetic energy will, in turn, heat at least an outer portion of the base polymer layer 26. This indirect heating of the base polymer layer 26 causes the base polymer layer 26 to remain in the softened and/or molten state for a longer period of time, thereby promoting increased diffusion and bonding between adjacent particles of coated powder 6 after they are deposited on the substrate. The melting points of the base polymer material and the coating polymer material preferably permit formation of a solid and liquid morphology. In some examples, the base polymer material has a first melting point, the coating polymer material has a second melting point, and the first melting point of the base polymer material is within 20 degrees Celsius of the of the second melting point of the coating polymer material. Materials with melting points within about 20 degrees, or about 18 degrees, or about 15 degrees Celsius have been found to generate sufficient heat to prolong the molten state of the base polymer layer 26 to promote diffusion and bonding between particles of coated powder 6 deposited and heated during additive manufacturing.

The materials selected for the base polymer layer 26 and the coating polymer layer 28 further may have compatible solubility parameters, further promoting bonding between adjacent particles of coated powder 6 when used in the additive manufacturing process. For example, the coating polymer material may be immiscible with the base polymer material to prevent phase separation and promote fusion of the base polymer layers of adjacent particles during additive manufacturing. In some examples, the base polymer material has a first solubility parameter, the coating polymer material has a second solubility parameter, and the second solubility parameter is within about 10 $J/cc^{0.5}$ of the first solubility parameter. Materials with solubility parameters within about 10 $J/cc^{0.5}$, or about 8 $J/cc^{0.5}$, or about 5 $J/cc^{0.5}$ of each other have been found to advantageously promote intermixing when heated during the additive manufacturing process.

In view of the foregoing considerations, suitable base polymer materials include polyethylene, polyethylene terephthalate, polypropylene, polyamides, polyetheretherketone, polyphenylene sulphide, polyetherimide, polystyrene, acrylonitrile/butadiene/styrene, polyacrylates, polyacrylonitrile, polycarbonate, or any mixture thereof.

Suitable coating polymer materials include polyvinyl alcohol, polyvinylidene fluoride, polyurethane, polyamide imide, polyamide, polyvinyl chloride, acrylic, cellulose esters, or mixtures thereof. Other examples of suitable coating polymer materials include materials and solvents that contain —OH, —NH, C=O, —N=O functional groups with a high dielectric loss factor. Further examples of suitable coating polymer materials include polyacrylonitrile (tan δ=0.1 at 60 Hz), polyethylene glycol, or mixtures thereof. In some examples, the coating polymer material is particularly responsive to electromagnetic energy in a specific frequency range, such as microwave energy in the GHz range.

TABLE 1 compares the dielectric loss factors, melting points, and solubility parameters for a specific example in which the coating polymer material is polyvinyl alcohol and the base polymer material is Ultem™ 1010 (polyetherimide):

TABLE 1

| Material | tan δ | Tm/Tg (degrees Celsius) | Solubility Parameter (J/cc$^{0.5}$) |
|---|---|---|---|
| Ultem™ 1010 (polyetherimide) | 0.001 | 186 | 28 |
| Polyvinyl Alcohol | 0.185 | 200 | 24 |

In this example, the use of Ultem™ 1010 (polyetherimide) as the base polymer material and polyvinyl alcohol as the coating polymer material is advantageous because polyvinyl alcohol has a high dielectric loss factor (tan δ=0.185 in the MHz-GHz frequency range), relative to Ultem™ 1010 (tan δ=0.001 in the MHz-GHz frequency range), the melting points of the two materials are 14 degrees Celsius apart, and the solubility parameters are close, indicating compatibility.

In addition to chemical characteristics, the base polymer layer 26 and the coating polymer layer 28 further may have physical characteristics that indicate suitability promoting fusion, bonding, and intermixing. For example, the base polymer layer 26 may have a diameter within a range of about 0.01 to about 0.5 millimeters, or within a range of about 0.05 to about 0.4 millimeters, or within a range of about 0.1 to about 0.3 millimeters. The coating polymer layer 28 may have a thickness within a range of about 1 micron to about 50 microns, or within a range of about 5 microns to about 25 microns, or within a range of about 10 microns to about 20 microns.

Figure 3:
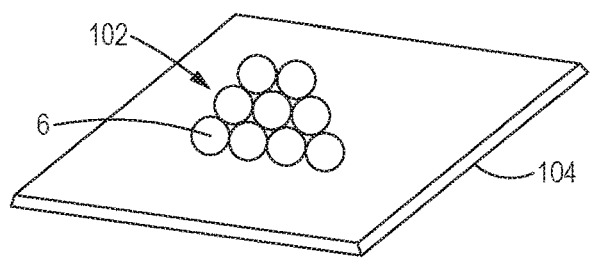
FIGS. 3-7 illustrate an example of a method for forming an object using particles of coated powder, according to the present disclosure.
Figure 4:
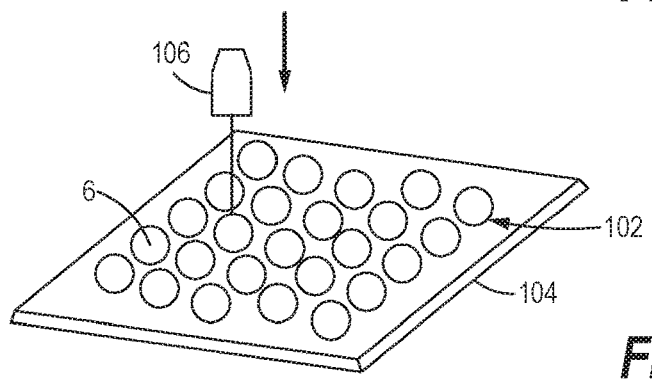
Figure 5:
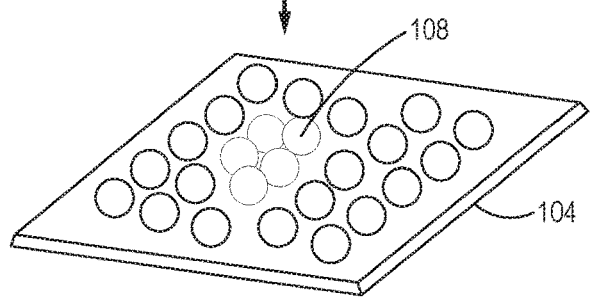
Figure 6:
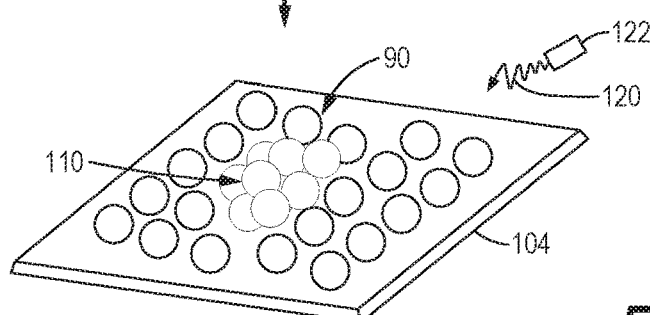

FIGS. 3-7 illustrate an example of a method for forming an object 90 using particles of coated powder 6, according to the present disclosure. As best shown in FIG. 3, the method begins with depositing a first build layer 102 particles of coated powder 6 on a substrate 104. Each of the particles of coated powder 6 includes a core formed by base polymer layer 26 that is surrounded by the coating polymer layer 28. The particles of coated powder 6 may be formed using the apparatus 2 of FIG. 1, or may be formed by a different apparatus and/or method. As shown in FIG. 4, the selected particles of coated powder 6 in the first build layer 102 are melted or sintered using a laser 106. FIG. 5 depicts the selected particles 108 of coated powder 6 of the first build layer 102 after melting or sintering. The method continues as shown in FIG. 6 by depositing a second build layer 110 of particles of coated powder 6 over the first build layer 102, and melting or sintering selected particles of coated powder 6, to form the object 90 with three dimensions.

As further shown in FIG. 6, the method includes directing electromagnetic radiation 120 toward the object 90 to promote diffusion and bonding between adjacent particles of coated powder 6. Because at least the coating polymer material is responsive to dielectric heating, it will melt to fill in any voids between adjacent particles of coated powder 6. The electromagnetic radiation 120 is provided by a heating source 122 that is controlled to direct the electromagnetic radiation 120 to selected areas of the object 90 or the entire object 90. A duration during which the electromagnetic radiation 120 is applied may also be controlled to strengthen one or more localized areas of the object 90, or the entire object 90. Further, the electromagnetic radiation 120, in one example, can be microwaves having frequencies in a range between 300 MHz and 300 GHz. In this example, the coating polymer material has a high dielectric loss factor and is susceptible to microwave radiation, and thus dielectric heating.

Since the coating polymer material has a higher dielectric loss factor, and the base polymer material has a lower dielectric loss factor, a frequency of the electromagnetic radiation may be selected so that only the coating polymer layer 28 is melted directly in response to the electromagnetic radiation. Additionally, the base polymer material may have a melting point near that of the coating polymer material, so that the base polymer layer 26 at least partially melts in response to heating of the coating polymer layer 28. Thus, the coating polymer layer 28 will directly melt and the base polymer layer 26 will indirectly melt in response to the electromagnetic radiation 120. In other examples, the electromagnetic radiation 120 may directly heat both the coating polymer layer 28 and the base polymer layer 26. In either case, melted portions of the base polymer layer 26 in adjacent particles may fuse together, preventing formation of voids between adjacent particles and promoting structural integrity of the object built.

In examples where the coating polymer material and the base polymer material have compatible solubility parameters (see the non-limiting example in Table 1), melting of both the coating polymer layer 28 and the base polymer layer 26 creates a homogenous mixture, and therefore no phase separation occurs when the melted layers subsequently cool and harden.

Figure 7:
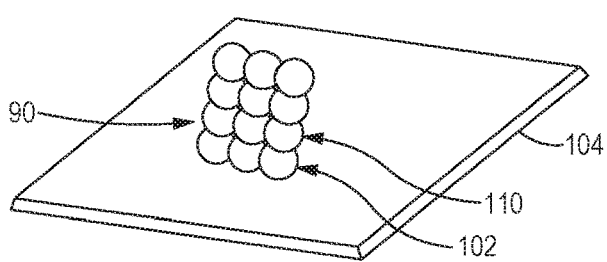

FIG. 7 illustrates the final object 90, with all un-melted or un-sintered particles of coated powder 6 removed from the substrate 104. The resulting object 90 has no voids between particles or build layers.

It should be understood that the drawings are not necessarily drawn to scale and that the disclosed examples are sometimes illustrated schematically. It is to be further appreciated that the following detailed description is merely exemplary in nature and is not intended to limit the disclosure the application and uses thereof. Hence, although the present disclosure is, for convenience of explanation, depicted and described as certain illustrative examples, it will be appreciated that it can be implemented in various other types of examples and in various other systems and environments.

What is claimed is:

1. A method of forming an object in an additive manufacturing (AM) process, the method comprising:
   advancing a plurality of powder particles through a chamber, each of the plurality of powder particles being formed of a base polymer material having a first dielectric loss factor with a first tan value in a predefined microwave frequency range;
   applying a liquid coating to an exterior of each of the plurality of powder particles, the liquid coating being formed of a coating polymer material distinct from the base polymer material and having a second dielectric loss factor with a second tan value in the predefined microwave frequency range, the second tan value being at least about 50 times larger than the first tan value of the base polymer material and thereby more susceptible to heating in response to electromagnetic energy than the base polymer material;

drying the liquid coating on the plurality of powder particles to form a plurality of coated powder particles, wherein each of the plurality of coated powder particles comprises a base polymer layer formed by the powder particle and a coating polymer layer formed by the liquid coating after drying the liquid coating; and forming an object in the AM process using the coated powder particles with the dried coating polymer material coated on the base polymer material.

2. The method of claim 1, in which advancing the plurality of powder particles through the chamber comprises providing the chamber with perforations and directing pressurized air through the perforations to form air streams through the chamber.

3. The method of claim 1, which applying the liquid coating to the exterior of each of the plurality of powder particles comprises spraying the liquid coating from a nozzle disposed in the chamber.

4. The method of claim 1, in which:
the base polymer material has a first melting point;
the coating polymer material has a second melting point; and
the first melting point is within about 20 degrees Celsius of the second melting point.

5. The method of claim 1, in which:
the base polymer material has a first solubility parameter;
the coating polymer material has a second solubility parameter; and
the second solubility parameter is within about 10 (Joules/cubic centimeter)$^{0.5}$ (J/cc)$^{0.5}$ of the first solubility parameter.

6. The method of claim 1, which the base polymer material comprises polyetherimide and the coating polymer material comprises polyvinyl alcohol.

7. The method of claim 1, in which the base polymer layer has a diameter of from about 0.1 to about 5 millimeters, and the coating polymer layer has a thickness of from about 1 to about 1,000 microns.

8. The method of claim 1, wherein the first dielectric loss factor of the base polymer material has a first tan value less than 0.05 and the second dielectric loss factor of the coating polymer material has a second tan value greater than 0.05.

9. The method of claim 4, wherein the first and second melting points permit formation of a solid and liquid morphology.

10. The method of claim 1, wherein the coating polymer material is immiscible with the base polymer material thereby preventing phase separation and promoting fusion of the base polymer layer with adjacent beads of the liquid coating.

11. The method of claim 1, wherein the coating polymer material includes a material or solvent containing at least one of —OH, —NH, C=O, or —N=O functional groups.

12. A method of fabricating an object by fused powder fabrication, the method comprising:
forming a coated powder by:
advancing a plurality of powder particles through a chamber, each of the plurality of powder particles being formed of a base polymer material having a first dielectric loss factor with a first tan value in a predefined microwave frequency range;

applying a liquid coating to an exterior of each of the plurality of powder particles, the liquid coating being formed of a coating polymer material distinct from the base polymer and having a second dielectric loss factor with a second tan value in the predefined microwave frequency range, the second tan value being at least about 50 times larger than the first tan value of the base polymer material and thereby more susceptible to heating in response to electromagnetic energy than the base polymer material; and drying the liquid coating on the plurality of powder particles to form a plurality of coated powder particles, wherein each of the plurality of coated powder particles comprises a base polymer layer formed by the powder particle and a coating polymer layer formed by the liquid coating after drying the liquid coating;

depositing the coated powder in a first build layer on a substrate;
heating selected portions of the first build layer;
depositing the coated powder in a second build layer on the substrate and over the first build layer;
heating selected portions of the second build layer; and
dielectrically heating the coating polymer layer of the coated powder in the selected portions of the first and second build layers using electromagnetic radiation to thereby fuse adjacent particles of the coated powder across an interface area.

13. The method of claim 12, in which:
the base polymer material has a first melting point;
the coating polymer material has a second melting point; and
the first melting point is within about 20 degrees Celsius of the second melting point.

14. The method of claim 12, in which dielectrically heating at least the coating polymer layer of the coated powder in the selected portions of the first and second build layers comprises applying the electromagnetic radiation in a microwave range of frequencies.

15. The method of claim 12, wherein the first dielectric loss factor of the base polymer material has a first tan value less than 0.05 and the second dielectric loss factor of the coating polymer material has a second tan value greater than 0.05.

16. The method of claim 13, wherein the first and second melting points permit formation of a solid and liquid morphology.

17. The method of claim 12, in which:
the base polymer material has a first solubility parameter;
the coating polymer material has a second solubility parameter; and
the second solubility parameter is within about 10 (Joules/cubic centimeter)$^{0.5}$ (J/cc)$^{0.5}$ of the first solubility parameter.

18. The method of claim 12, in which the base polymer material comprises polyetherimide and the coating polymer material comprises polyvinyl alcohol.

* * * * *